US010053599B2

(12) United States Patent
Cadiz Bedini

(10) Patent No.: US 10,053,599 B2
(45) Date of Patent: Aug. 21, 2018

(54) METHOD AND DEVICE FOR POLYMERIZING A COMPOSITION COMPRISING HYDRIDOSILANES AND SUBSEQUENTLY USING THE POLYMERS TO PRODUCE SILICON-CONTAINING LAYERS

(71) Applicant: FORSCHUNGSZENTRUM JUELICH GMBH, Juelich (DE)

(72) Inventor: Andrew Paolo Cadiz Bedini, Aachen (DE)

(73) Assignee: Forschungszentrum Juelich GmbH (DE)

( * ) Notice: Subject to any disclaimer, the term of this patent is extended or adjusted under 35 U.S.C. 154(b) by 61 days.

(21) Appl. No.: 15/100,831

(22) PCT Filed: Nov. 26, 2014

(86) PCT No.: PCT/DE2014/000617

§ 371 (c)(1),
(2) Date: Jun. 1, 2016

(87) PCT Pub. No.: WO2015/085980

PCT Pub. Date: Jun. 18, 2015

(65) Prior Publication Data

US 2016/0297997 A1 Oct. 13, 2016

(30) Foreign Application Priority Data

Dec. 11, 2013 (DE) ........................ 10 2013 020 518

(51) Int. Cl.
*H01L 21/00* (2006.01)
*C09D 183/16* (2006.01)
(Continued)

(52) U.S. Cl.
CPC ........... *C09D 183/16* (2013.01); *C08G 77/06* (2013.01); *C08G 77/60* (2013.01); *C23C 18/122* (2013.01); *H01L 31/1804* (2013.01)

(58) Field of Classification Search
CPC ...... C08G 77/06; C08G 77/60; C09D 183/08; C09D 182/16
See application file for complete search history.

(56) References Cited

U.S. PATENT DOCUMENTS

2013/0183223 A1* 7/2013 Wieber .................. C01B 33/04 423/275
2016/0155637 A1* 6/2016 Mader ................ C23C 18/1204 257/618

FOREIGN PATENT DOCUMENTS

DE 10 2005 027 757 12/2006
DE 10 2010 041 842 4/2012
(Continued)

OTHER PUBLICATIONS

Lyer, G. et al.: Solution-Based Synthesis of Crystalline Silicon from Liquid Silane through Laser and Chemical Annealing, ACS Appl. Mater. Interfaces 4, 2680-2685 (2012).
(Continued)

*Primary Examiner* — Selim Ahmed
*Assistant Examiner* — Evan Clinton
(74) *Attorney, Agent, or Firm* — Jordan and Koda, PLLC

(57) ABSTRACT

A method for polymerizing a composition including hydridosilanes and subsequently using the polymers to produce silicon containing layers, comprising the following steps: a) providing a substrate; b) providing a composition including at least one hydridosilane that is dissolved in at least one organic and/or inorganic solvent, or including at least one hydridosilane that is already present in liquid form without solvent, wherein the hydridosilanes comprise at least one linear and/or one branched hydridosilane of the general formula $Si_nH_{2n+2}$, where n≥3, and/or a cyclic hydridosilane of the general formula $Si_nH_{2n}$, where n≥3; c) polymerizing the composition from step b) by way of acoustic cavitation; and d) coating the surface of the substrate with reaction products from step c). A device for polymerizing a composition including hydridosilanes and subsequently using the polymers to produce silicon containing layers, comprising at least one reaction vessel (1) containing a composition that includes at least one hydridosilane that is dissolved in at least one organic and/or inorganic solvent, or at least one
(Continued)

hydridosilane that is already present in liquid form without solvent, wherein the hydridosilanes comprise at least one linear and/or branched hydridosilane of the general formula $Si_nH_{2n+2}$, where n≥3, and/or a cyclic hydridosilane of the general formula $Si_nH_{2n}$, where n≥3, and/or containing the abovementioned hydridosilane solution or the pure liquid hydridosilane, to which at least monosilane and/or disilane and/or boron containing dopant and/or phosphorus containing dopant and/or a noble gas from the group Ar, He and/or nanoparticles and/or a polymerization initiator and/or a catalyst and/or surface tension modifying agents can be added, and an ultrasound source and/or a sound transducer (4) for generating acoustic cavitation and/or capillary waves, wherein the reaction vessel (1) has at least one closable opening (6), the substrate (8) to be coated is disposed opposite the opening (6), and the substrate (8) comprises a heating source (9) on the surface that faces away from the coating surface.

20 Claims, 7 Drawing Sheets

(51) Int. Cl.

| | |
|---|---|
| ***C08G 77/60*** | (2006.01) |
| ***C08G 77/06*** | (2006.01) |
| ***C23C 18/12*** | (2006.01) |
| ***H01L 31/18*** | (2006.01) |

(56) References Cited

FOREIGN PATENT DOCUMENTS

| | | |
|---|---|---|
| EP | 1 087 428 | 3/2001 |
| WO | WO-2011/061106 | 5/2011 |
| WO | WO-2011/104147 | 9/2011 |
| WO | WO-2012/041837 | 9/2011 |
| WO | WO-2012/084261 | 6/2012 |

OTHER PUBLICATIONS

Shimoda, T., et al: Solution-Processed silicon films and transistors, Nature 440, 783-786 (2006).

Masuda, T., et al: Fabrication of solution-processed hydrogenated amorphous silicon single-junction solar cells, Appl. Phys. Lett. 100, 253908 (2012).

Suslick, K.S., Price G.J., Applications of Ultrasound to Material Chemistry, Annu. Rev. Matter. Sci. 29, 295-326 (1999).

Lang, R. J., Ultrasonic Atomization of Liquids, J. Acous. Soc. Am. 34, 1 (1962).

* cited by examiner

METHOD AND DEVICE FOR POLYMERIZING A COMPOSITION COMPRISING HYDRIDOSILANES AND SUBSEQUENTLY USING THE POLYMERS TO PRODUCE SILICON-CONTAINING LAYERS

The invention relates to a method for polymerizing a composition comprising hydridosilanes and subsequently using the polymers to produce silicon-containing layers. The invention further relates to a device that makes the aforementioned method possible, to layers produced by way of the method, and to the use thereof to produce semiconducting or insulating thin layers with or without nanoparticles embedded therein.

BACKGROUND OF THE INVENTION

To produce solar cells, semiconductor layers having differing dopings are required, which include at least one Schottky or p-n junction. As is known from the prior art (WO 2011/061106 A2), a pin junction can be generated by depositing an amorphous layer sequence, containing higher silanes, among other things, on a suitable substrate using liquid phase deposition, the junction acting as a solar cell with suitable front and rear contacts. In the production of thin-film solar cells based on p-i-n junctions, the individual doping layers are doped as an n-silicon layer with a suitable phosphorus compound, for example, such as white phosphorus, and as a p-silicon layer with a suitable boron compound, for example, such as decaboron, wherein the suitable phosphorus or boron compounds can be added to the liquid phases. These may be liquid themselves or dissolve in the liquid phase. No additional dopants are added when an intrinsic (i-), which is to say undoped, silicon layer is being produced.

In general, compositions comprising hydridosilanes, among other things, are used to produce silicon-containing layers based on liquid silane. Prior to being applied to the respective substrate, these compositions are initially polymerized into higher hydridosilanes.

In general, a polymerization by way of electromagnetic radiation (such as by way of ultraviolet (UV) light) or by supplying heat is referred to as a ring-opening polymerization when the reactant is composed of cyclic monomers, such as cyclopentasilane ($Si_5H_{10}$) or cyclohexasilane ($Si_6H_{12}$). These are cleaved using the action of light or heat, and reacted alone or by further bonding other hydridosilanes to form linear and/or branched polymer chains made of silicon and hydrogen. The resulting hydridosilanes are denoted by the general formula $—(SiH_2)_n—$ and also referred to as polysilanes or oligosilanes. Hydridosilanes having a molar mass of less than approximately 302 g/mol (which is to say ≤10 Si atoms) are classified as "lower hydridosilanes" and those having higher molar masses as "higher hydridosilanes."Hydridosilanes present in liquid form are also referred to as liquid silane.

Silicon thin layers based on liquid silane are normally applied to a substrate by way of spin coating. It is customary, for this purpose, to dilute the liquid silane in a solvent. This solution is subsequently polymerized. In the case of cyclic reactants, the solution can be irradiated with UV light so as to enable photopolymerization of the dissolved liquid silane. The photopolymerized solution is subsequently filtered so as to remove insoluble hydridosilanes from the solution, or to control the molar mass of the photopolymerized hydridosilane. The filtered solution is subsequently applied to the substrate by way of spin coating. At the end, the layer is heated so as to evaporate the solvent and convert the silicon into an amorphous form. The latter is referred to as conversion. As an alternative to the direct wet-chemical method, it is also possible to conduct a carrier gas, such as hydrogen, through the liquid silane (bubbler system). Finally, this gas mixture is decomposed by way of plasma-enhanced chemical vapor deposition (PECVD) or hot wire chemical vapor deposition (HWCVD), and deposited on the substrate.

The resultant silicon layers can comprise a mixture of microcrystalline, polycrystalline and amorphous structures, depending on the conditions (such as process temperature, heating duration, hydrogen partial pressure) under which the conversion takes place. The crystallinity of the layer, which is typically in an amorphous state, can subsequently be increased, for example by way of laser irradiation [1] or thermal treatment (for example, temperatures higher than 600° C.).

The drawback of photochemical methods known from the prior art for producing coating solutions (precursors) for silicon layers is that they are very time- and labor-intensive. Photopolymerization is a very time-consuming method. Irradiations typically last between 10 and 120 minutes [2] [3] or up to 840 minutes [DE 10 2010 041 842 A1], and the use of UV irradiation incurs additional procurement costs, and safety measures may need to be taken.

(WO 2012/084261 A1) describes another method for depositing silicon-containing layers onto a substrate, wherein a focused beam of charged particles (ions or electron beam) is used to dissociate a polysilane-based precursor directly on a substrate. The method has disadvantages when silicon layers for optoelectronic applications are produced since it requires the use of expensive vacuum technology and a modified scanning electron microscope (SEM). As an alternative to the use of an electron beam, it is possible to use $Ga^+$ ions instead. Here, the method has the disadvantage that the production of intrinsic silicon layers is made more difficult due to the doping property of Ga.

Hydridosilanes can also be caused to polymerize using thermal methods (DE 10 2010 041 842 A1). Here, for example, reaction mixtures made of neopentasilane $Si(SiH_3)_4$, among other things, are heated at 154° C. and thermally treated for approximately 200 to 480 minutes.

The supply of heat achieves polymerization by cleaving the Si—Si and/or Si—H bonds of the cyclic or linear or branched monomers. Higher hydridosilanes are subsequently created by chain formation. For this purpose, it is necessary to heat pure liquid silane, or a diluted liquid silane, in the form of a hydridosilane solution (=hydridosilanes diluted in a solvent) to high temperatures of up to 235° C. (WO 2011/104147 A1), so as to bring about thermal decomposition. This method has the disadvantage that it is energy-intensive and that, due to the heating process or the residual thermal energy of the solution, the polymerization cannot be immediately initiated (due to the heating process) or immediately terminated (due to the cooling process) without additional work steps.

The disadvantages of all of the above-mentioned methods for producing coating solutions for silicon layers are the time-intensive temperature and UV irradiation or filtration steps necessary for polymerization or molecular weight limitation. When the hydridosilanes are applied to the substrate by way of spin coating, it is a further disadvantage that valuable material is wasted, since the solution, as a result of the spinning, is not only distributed on the substrate surface, but due to the centrifugal force approximately 90% of if it thrown beyond the surface to be coated. Moreover, the substrate of thin layers produced by way of spin coating is inhomogeneously covered, wherein only planar, solid substrates can be used. When ultrathin layers (<2 nm) are used for coating or layers are grown in the form of monolayer coating, spin coating is not a very suitable method due to significant surface roughness and undulations of >3 nm, for example (WO 2011/104147 A1). When nanoparticles are dispersed in a solvent (such as cyclooctane, ethanol, toluene, water), in a hydridosilane solution or directly in the pure liquid hydridosilane (both in monomeric and polymeric hydridosilane), the layers produced thereafter by way of spin coating have both a suboptimal nanoparticle embeddedness and a suboptimal nanoparticle distribution. When structured surfaces are coated with nanoparticles, coverings produced by way of spin coating have a low quality, for example with an inhomogeneous nanoparticle distribution and low reproducibility. Surfaces thus structured are used in photovoltaics for light trapping purposes and as plasmonic reflection gratings, for example, so as to increase the efficiency of solar cells.

The use and the influence of ultrasonic waves and acoustic cavitation on chemical and physical processes are known from the prior art. Ultrasound is used to trigger acoustic cavitation, which is to say the formation, growth and implosion of microcavities in the liquids. The pressure prevailing in the microcavities and the effective temperature are in the range of 1000 bar and 5000° C., respectively [4]. The process temperature, which is to say the temperature that prevails in the liquid or in the reaction vessel itself, however, can remain at temperatures below 0° or at room temperature or in the range below 150° C., depending on which use is intended and which device is used in each case. Ultrasonic waves can be used for treating solutions and objects to enable purely physical effects, such as deagglomeration and dispersion of particles, formation of emulsions or ultrasonic cleaning. The chemical effects are based on phenomena triggered in microcavities and the immediate vicinity thereof, such as bond cleavage through tensile forces or high transient temperatures and radical generation. The use of ultrasound represents an alternative to traditional photochemistry, thermochemistry or catalytic chemistry. In general, chemistry supported by way of acoustic cavitation is known as “sonochemistry” and has countless applications, such as the degradation of organic polymers, polymerization of organic compounds, generation of radicals, acceleration of chemical reactions, and the like.

It is the object of the invention to provide a method for polymerizing a composition comprising hydridosilanes and subsequently using the polymers to produce silicon-containing layers, which allows a simpler and faster method for producing silicon-containing layers compared to the prior art than has been previously possible according to the prior art.

If is a further object of the Invention to make a device available that is adapted to this method, and to provide silicon layers produced by way of this method. The invention further relates to the use of these silicon-containing layers to produce semiconducting or insulating thin films with or without nanoparticles embedded therein.

Layers that are produced by way of the present invention can have higher-quality structural and electronic properties. Deposition by way of aerosol coating allows not only comparable or lower surface roughness and undulations, but also more homogeneous covering of the substrate to be achieved as compared to previously known methods.

If, according to the invention, simultaneous periodic heating of the substrate and a continuous supply of aerosol are carried out during the coating process, the amorphous layer growing in the immediate vicinity of the substrate is completely or partially protected from the influence of impurities generally present in the nitrogen atmosphere. The layers produced by the method according to the invention can be used in solar cells, photodiodes or thin-film transistors, for example.

The objects of the invention are achieved by a method having the characteristics according to the main claim, and by a device and a silicon layer and the use thereof having the features according to the additional independent claims. Advantageous embodiments of the method, the device, and the silicon layer will be apparent from the respective dependent claims.

SUMMARY OF THE INVENTION

The invention relates to a method for polymerizing a composition comprising hydridosilanes and subsequently using the polymers to produce silicon-containing layers, comprising the following steps:

a) providing a substrate;
b) providing a composition including at least one hydridosilane that is dissolved in at least one organic and/or inorganic solvent (hereafter also referred to as hydridosilane solution), or including at least one hydridosilane that is already present in liquid form without solvent (also synonymously referred to as liquid silane or pure liquid hydridosilane), wherein the above-mentioned hydridosilanes comprise at least one linear and/or branched hydridosilane of the general formula $Si_nH_{2n+2}$, where n≥3, and/or a cyclic hydridosilane of the general formula $Si_nH_{2n}$, where n≥3;
c) polymerizing the composition from step b) by way of acoustic cavitation and
d) coating the surface of the substrate with reaction products from step c).

The hydridosilanes to be polymerized can comprise at least one linear and/or branched hydridosilane of the general formula $Si_nH_{2n+2}$, where n≥3, and/or a cyclic hydridosilane of the general formula $Si_nH_{2n}$, where n=3 to 15.

The composition according to step b) can include at least one “lower” hydridosilane comprising≤10 Si atoms and having a molar mass between 90 and 305 g/mol. This can include, in particular, at least one hydridosilane from the group trisilane, tetrasilane, pentasilane, hexasilane, heptasilane, cyclopentasilane, cyclohexasilane or neopentasllane.

In one advantageous embodiment of the method, at least monosilane- and/or disilane-and/or boron-containing dopant and/or phosphorus-containing dopant and/or a noble gas from the group Ar, He and/or nanoparticles and/or a polymerization initiator and/or a catalyst and/or surface tension-modifying agents can be added to the composition according to step b).

The polymerized hydridosilane solution or the polymerized pure liquid hydridosilane can preferably include hydridosilanes having a molar mass between approximately 92 and $1\times10^6$ g/mol.

In one advantageous embodiment of the method, at least one organic and/or inorganic solvent is used. This can comprise cyclooctane, ethanol, toluene or water, for example. However, it is also possible to use any additional known organic and/or inorganic solvents according to the prior art.

The concentration of the hydridosilanes in the solvent can range between 0 and ≤100% by weight. The set concentration of hydridosilanes is dependent on the polymerization speed, the content of hydridosilanes in the aerosol, and the growth rate of the silicon layer that are desired.

At a silane concentration of 0% by weight, a solvent without hydridosilanes, but with admixed nanoparticles, is present. At a hydridosilane concentration of 100% by weight, pure liquid hydridosilane (=liquid silane) is present, or liquid silane to which nanoparticles were added. The composition according to step b) can furthermore comprise a hydridosilane solution, comprising at least one linear or branched hydridosilane of the general formula $Si_nH_{2n+2}$, where n≥3, and/or a cyclic hydridosilane of the general formula $Si_nH_{2n}$, where n≥3, which is dissolved in at least one solvent, nanoparticles being added to this hydridosilane solution. In general, nanoparticles are added in concentrations of <0.1% by weight.

When a 0% by weight silane concentration is used, an additional silicon-containing solution for coating the substrate may be used to subsequently produce the silicon-containing layer, or the required silicon may be applied to the substrate in another manner.

In one advantageous embodiment of the method, reaction products from step c) can be converted into aerosols by way of acoustic cavitation and/or capillary waves, and these can be brought in contact with the surface of the substrate for the coating process according to step d).

The acoustic cavitation for polymerization or capillary wave formation for aerosol formation can be generated with the aid of a magnetorestrictive or piezoelectric ultrasound source and/or a liquid-operated or gas-operated sound transducer. Here, sonotrodes or piezoceramics can be mentioned, by way of example, as ultrasound sources.

To this end, the ultrasound source and/or the sound transducer, for example, may be brought in direct contact with the composition from step b) for the polymerization according to step c) or for the aerosol formation, or can be brought in contact with the composition from step b) by way of an intermediate liquid (intermedium). When an intermedium is used, for example, a small liquid volume of the composition to be polymerized present in a smaller reaction vessel can be immersed into a larger vessel comprising the intermedium, so that the ultrasonic waves of the piezoceramic or sonotrode are transmitted via the intermedium to the liquid in the smaller reaction vessel. The intermedium can serve as a filling volume and/or coolant, which is needed to transmit the ultrasonic waves or to dissipate heat. The liquid volume of the composition to be polymerized can thereby be reduced, which is advantageous in particular when expensive reactants are used. The intermedium should generally be a liquid. The ultrasonic waves of the piezoceramic can be focused via the intermedium onto a focal point in the reaction vessel.

The tip of the sonotrode or the piezoceramic should preferably be disposed below the liquid surface of the composition from step b) or of the intermedium. For the polymerization according to step c), the sonotrode can be introduced into the composition or the intermedium either from beneath or from above.

The term polymerization within the scope of the present invention shall be understood to mean synthesis reactions that convert identical or different monomers into oligomers or polymers. While in some cases the chain formation processes tend to take place in oligomerization, polymerization tends to take place with longer treatment durations and/or when reactants having low molar masses are used. Thus, in the context of the method according to the invention, the linking of different reactants is referred to as polymerization. Polymerization shall be understood to mean addition polymerizations (as a chain reaction and/or a step reaction), condensation polymerizations, ring-opening polymerizations, copolymerizations, and depolymerizations. These reactions take place in the microcavities and the immediate high-temperature and high-pressure environment thereof, or are triggered by reactions of radicals generated by way of acoustic cavitation in the volume of liquid. The aerosol formation can take place in the same reaction vessel according to the invention, or in an additional reaction vessel, which can also be referred to as an aerosolization cell.

Within the scope of the present invention, the term "aerosol" or "aerosol droplets" shall be understood to mean liquid aerosol particles having lower and higher hydridosilanes or nanoparticles dissolved therein, or colloids of lower and higher hydridosilanes or nanoparticles suspended in $N_2$.

The reaction speed of the polymerization and of the aerosol formation can be deliberately controlled, for example by way of the concentration of added nanoparticles and/or the concentration of hydridosilanes in the solvent. In general, it can be assumed that the speed of the polymerization reactions will also increase when the concentration of nanoparticles increases, or the concentration of hydridosilanes increases.

The temperature of the composition and the polymerization and aerosol formation rates can be established or varied both via the operating mode (such as continuous or pulsed mode) of the ultrasound source and via a cooling device, it is particularly advantageous that the polymerization can be terminated/continued directly by switching the ultrasound source off/on.

With respect to the influence of the temperature, it can generally be assumed that the vapor pressure of the solvent or of the hydridosilanes in the microcavities will rise as the temperature increases, and thus the dampening of the implosions of the microcavities will likewise increase, the sonochemical effects consequently being weakened.

The polymerization of the composition according to step c) and the conversion of the reaction products from step c) into aerosols can preferably be carried out starting at the freezing point of the respective solvent used and/or of the hydridosilanes, up to the respective limit starting at which a purely thermal conversion of the reactants takes place, or, when an open reaction vessel is used, at which evaporation of the composition takes place. The present method is based neither on a photolytic nor a thermal treatment, but is based on the above-mentioned chemical and physical effects of acoustic cavitation.

The polymerization and/or aerosol formation can be carried out at temperatures between −70° C. and 155° C. Preferably a temperature range from approximately −55° C. to 150° C. can be used, wherein the aerosol formation can preferably be carried out at room temperature up to approximately 30° C.

The ultrasound source or the sound transducer used to generate acoustic cavitation car be used in pulsed operation or in continuous operation, using continuous flow cooling of the reaction vessels. The temperature of the liquid in the reaction vessel can thus be set via the particular working cycle of the ultrasound source/of the sound transducer, which is also referred to as a pulsed working cycle, or via continuous flow cooling such that the hydridosilane solution or the pure liquid hydridosilane or the solution that is mixed with gaseous silane is not overheated by the energy supplied from the acoustic cavitation and ultrasonic waves and, in the case of a sonotrode and/or piezoceramic, by heat generation at the ultrasound source/liquid interface. In this way, it is possible to prevent components of the solution from transitioning into a gaseous state of aggregation. At a temperature of approximately 111° C. for example, the solvent toluene would evaporate, thereby making the processing of the liquid more difficult. Typical process temperatures, however, are below 75° C.

The polymerization can be carried out at an acoustic treatment duration (also synonymously referred to as sonication duration) of between 1 microsecond and 15 hours. Sonication durations between 0.05 and 12 hours are preferred. However, a sonication duration from several microseconds to milliseconds may also be sufficient, for example. The shortest sonication duration used can also be the shortest possible sonication duration that can be technically set with the respective ultrasound source/the sound transducer.

The product formation of the polymerization can be monitored by way of nuclear magnetic resonance (NMR), mass spectrometry and/or chromatography methods, and based thereon, the temperature of the liquid in the reactor can be reduced with the aid of continuous flow cooling or by varying the working cycle of the introduced acoustic cavitation energy, for example as soon as the mass spectrometry method ascertains an elevated concentration of reaction products such as pentasilane ($Si_6H_{12}$).

The method can be carried out either in one or in two reaction vessels. When two reaction vessels are used, the polymerization by way of acoustic cavitation according to step c) is carried out in the first reaction vessel (=polymerization cell), and the aerosol formation by way of acoustic cavitation and/or capillary waves is carried out in the further reaction vessel (=aerosolization cell). The reaction products of the polymerization can then be transferred from the first reaction vessel into the second reaction vessel for aerosol formation. This can be carried out, for example, via a connecting line between the two reaction vessels, or by withdrawing the polymerized composition from the first reaction vessel and adding it to the second reaction vessel.

In the alternative embodiment of the method according to the invention, in which a single reaction vessel is used. In a still more advantageous manner both the polymerization by way of acoustic cavitation according to step c) and a subsequent aerosol formation by way of acoustic cavitation and/or capillary waves are carried out. This method represents considerable advantages over the prior art since now, according to the invention, both the polymerization and the aerosol formation of a composition including hydridosilanes is made possible in-situ.

The polymerization speed (increase in the molar mass (g/mol) per unit time) and the aerosol formation rate (volume of aerosols generated per unit time), the polymerization yield (percentage of monomeric hydridosilanes that are polymerized into higher hydridosilanes), and the aerosol flow in the direction of the substrate (volume of aerosols generated per unit time per unit surface area) can be set by way of the concentration of added nanoparticles, the residual concentration of the reactants (monomeric hydridosilanes), the operating mode (which is to say continuous or pulsed), the amplitude and frequency of the ultrasound source/the sound transducer which generates the acoustic cavitation and/or capillary waves, and via cooling devices.

The nanoparticles that can be added are in a size range of <100 nm, and preferably in the range of <50 nm. The nanoparticles can be produced separately, for example, and added to the composition. The method according to the invention allows an in-situ treatment of nanoparticles, so that the dispersion, deagglomeration, functionalization and embedding of the same can take place in the device according to the invention, which can be used both as a polymerization cell and as an aerosolization cell at the same time. This has the significant advantage that, for example, unstable nanoparticle dispersions can be successively treated in-situ, embedded into polymerized/unpolymerized hydridosilane, aerosolized and applied to a substrate. The substrate can be located inside or outside the device according to the invention. This prevents the nanoparticles from forming agglomerates, which represents a considerable material-related problem. According to the existing prior art, two separate steps are required for this purpose, which necessitate at least two different pieces of equipment (such as a "ball mill" and a "spin coater"). As a result of the present invention, this can advantageously be carried out in one step and in one device. Nanoparticles from the group CuO, $Cu_2O$, $Cu_2S$, CuS, $Fe_2O_3$, FeS, $FeS_2$, $FeSi_2$, SnS, ZrS can be mentioned here by way of example, and without limitation.

It is possible to use substrates having a smooth or a structured surface. For example, glass, quartz, metal or crystalline silicon substrates are suited. The substrate may also be curved or flexible. The substrates can also be present with an appropriate coating, such as glass coated with ZnO, with or without structuring.

The substrate can be coated with the generated aerosols containing hydridosilanes, nanoparticles and/or nanoparticles embedded into hydridosilanes. When pure liquid hydridosilanes are used, the substrate can be coated with gaseous silanes and/or solid hydridosilanes having a molar mass between 32 g/mol and $1\times10^6$ g/mol, and when a hydridosilane solution is used, the substrate can be coated both with gaseous silanes and/or liquid hydridosilanes and/or solid hydridosilanes and with these gaseous silanes and/or liquid hydridosilanes and/or solid hydridosilanes that are present in diluted form in a solvent and in the form of solvent/hydridosilane aerosol droplets. When a hydridosilane solution is used, a 1 to 30% by weight hydridosilane solution is used, for example (the remainder is solvent).

By setting the temperature or the temperature gradient of the substrate, the concentration of the hydridosilanes in the liquid film still to be converted and/or to be dried on the surface of the substrate can be controlled in a deliberate manner. Using a continuous aerosol flow onto the substrate, a growing silicon film can be generated, in which advantageously the deeper silicon layers have no direct contact with the atmosphere of the reaction chamber since they are protected by the regrowing outer layers from possible oxidation by residual oxygen in the $N_2$ atmosphere, for example in a glove box. In a glove box, the concentration of $H_2O$ and $O_2$ is typically <1 ppm.

The temperature at which the conversion of the layer made of higher hydridosilanes takes place, the layer growth rate, and the temperature and evaporation rate of the solvent can advantageously be set and controlled by the present method in a precise and deliberate manner. This has considerable advantages with respect to the conversion mechanism of the higher hydridosilanes into a solid, amorphous, thin film. Since the generation rate and the composition of the aerosol can be set exactly, and the aerosol formation can be started or stopped immediately and also be directed precisely at the substrate, the polymerization and coating method according to the invention has considerable advantages over the prior art.

Both droplets and volatile hydridosilanes can be deposited onto the substrate. Lower hydridosilanes such as trisilane ($Si_3H_8$) are readily volatile and are applied to the substrate to be coated by physical vapor deposition. Soluble hydridosilanes and those not too heavy (up to a molar mass of approximately $1\cdot10^4$ g/mol) are transported to the substrate as aerosol droplets or particles. Hydridosilanes having a high molar mass (such as $>1\cdot10^4$ g/mol), which are not suitable for coating, and are not soluble in the solvent or in other silanes, such as cyclopentasilane, are retained in the reaction vessel. The latter can be further sonified in the reaction vessel until they reach the appropriate molar mass, if necessary by way of depolymerization. The generated aerosol has a typical mean droplet diameter (MMD) between 0.1 μm and 10 μm and is conducted to the substrate using an aerosol flow between 100 nl/min to 100 ml/min. The aerosol flow can additionally also be set by using a carrier gas, such as Ar or $N_2$, to transport the aerosols more quickly or slowly in the direction of the substrate.

According to the physical model described in [5], the mean droplet size of the aerosol generated by way of an ultrasound source or a sound transducer is proportional to $f^{2/3}$ and to $S^{1/3}$, f being the excitation frequency and S the surface tension of the solution. The droplet size can thus be determined or set as a function of the frequency of the ultrasonic waves to be applied, by selecting the solvent or by adapting the surface tension of the solution.

In this way, a calibration curve can be created for every composition, which shows which mean particle size of the aerosol and/or which vapor-deposited silane species and/or higher hydridosilanes are created at which frequency/amplitude or sonication duration, or what the polymerization yield is.

The amount of nanoparticles or hydridosilanes that is applied to the substrate can be set arbitrarily as a function of the desired process parameters, such as nanoparticle coverage, length of the coating duration or polymerization yield and/or final layer thickness.

Using empirical preliminary examinations, a correlation can be determined between the sonication duration and the mean molar mass of the polymers present in the aerosol using gel permeation chromatography (GPC) or nuclear magnetic resonance (NMR). In this way, it is possible, for example, to determine for every composition that is used which sonication duration must be set to generate hydridosilanes having the desired molar mass.

The coating quality, the morphological and electronic properties, and the elemental composition of the layers can be checked and characterized, for example, by way of optical microscopy, atomic force microscopy (AFM), scanning electron microscopy (SEM), profilometry, Raman spectroscopy, Fourier transform infrared spectroscopy (FT-IR), photothermal deflection spectroscopy (PDS), secondary ion mass spectroscopy (SIMS), or hydrogen effusion measurements, and can also be used to set the coating parameters.

The coating process can be carried out in a deposition step, exclusive of drying and conversion. The coating process is carried out until the desired final layer thickness has been reached. A multi-stage coating process is likewise possible, for example to apply layers having differing compositions.

The molecular size of the hydridosilanes with which the substrate is coated can be set by using a molecular sieve, which is disposed at the outlet opening of the reaction vessel or at the aerosolization cell, for example. This sieve allows only molecules having the desired size to pass, which then deposit on the substrate. The particle size can additionally be set by way of a heating element at the opening of the reaction vessel or of the aerosolization cell. By controlling the temperature of the opening neck or by aerosol flowing through next to the heating element, partial evaporation of the respective solvent that is still present in the aerosol particles can be achieved, so that the particle size of the aerosol, and thus the concentration of hydridosilanes or nanoparticles that are applied to the substrate, can be regulated. The mean size of the aerosol particles is dependent on the nanoparticle and (monomeric and polymeric) hydridosilane concentrations, among other things.

The aerosol particles, aerosol droplets can be conducted through a closable opening or through a closure in the reaction vessel or in the aerosolization cell in a manner directed at the substrate surface. The substrate can also be in a moving or rotating state during this process. The aerosol jet can also be deliberately directed at the substrate via nozzles, for example, or using the ink jet technology known from the prior art (EP 1087428 A1), Instead of converting the reaction products from step c) into aerosols and using the same to coat the substrate surface, the surface of the substrate can be coated using the spin coating method known from the prior art and/or immersion coating method and/or blade coating method and/or ink jet printing method. For this purpose, the reaction products according to step c) can be applied, for example, directly to the surface of the substrate by way of spin coating or another of the above-mentioned methods.

To produce a doped silicon layer, dopants can be applied to the substrate by mixing these into the composition according to step b) or subsequent to the polymerization process according to step c).

So as to improve the layer properties, conversion in a low-pressure and/or hydrogen-containing atmosphere can be carried out subsequent to the substrate surface being coated. Post-treatment of the silicon layer in a reducing hydrogen atmosphere is advantageous to hydrogenate the silicon, which is to say to passivate the silicon, among other things by saturating "dangling bonds" (unsaturated silicon bonds) with hydrogen. Conversion in a hydrogen atmosphere may also be advantageous, since in this way the hydrogen concentration gradient within and outside the silicon-containing layer can be reduced. This may make it possible to regulate the hydrogen content of the layer after the conversion or to lower the defect density of the layer.

In an advantageous embodiment of the method, UV irradiation can be carried out and/or thermal energy can be supplied during the polymerization process according to step c), wherein these act in a supporting manner to accelerate the polymerization reactions, which is to say that these result in a faster conversion of the reactants into the products.

The invention further relates to a device for polymerizing a composition including hydridosilanes and subsequently using the polymers to produce silicon-containing layers, comprising at least one reaction vessel, containing a composition that includes at least one hydridosilane dissolved in at least one organic and/or inorganic solvent, or at least one hydridosilane that is already present in liquid form without solvent, wherein the hydridosilanes comprise at least one linear and/or branched hydridosilane of the general formula $Si_nH_{2n+2}$, where n≥3, and/or a cyclic hydridosilane of the general formula $Si_nH_{2n}$, where n≥3, and/or containing the above-mentioned hydridosilane solution or the pure liquid hydridosilane, to which at least monosilane- and/or disilane- and/or boron-containing dopant and/or phosphorus-containing dopant and/or a noble gas from the group Ar, He and/or nanoparticles and/or a polymerization initiator and/or a catalyst and/or surface tension-modifying agents can be added, and an ultrasound source and/or a sound transducer for generating acoustic cavitation, wherein the reaction vessel has at least one closable opening, the substrate to be coated is disposed opposite the opening, and the substrate comprises a heating source on the surface that faces away from the coating surface.

The ultrasound source and/or the sound transducer for generating the acoustic cavitation can be a magnetorestrictive or piezoelectric ultrasound source and/or a liquid-operated or gas-operated sound transducer. Sonotrodes or piezoceramics can be mentioned by way of example here. This ultrasound source or the sound transducer can be located either in the reaction vessel or in the intermedium.

The ultrasonic waves can be passed on to the composition via the intermedium. In one embodiment of the device according to the invention, the ultrasonic waves are preferably focused onto a focal point in the reaction vessel by way of a piezoceramic.

A suitable frequency range for sonotrodes is 20 kHz to 50 kHz, for example. A suitable frequency range for piezoceramics is 500 kHz to 10 MHz, for example.

The reaction vessel can be located partially or entirely in a coolant vessel provided with a coolant inlet and outlet.

The vessel should have at least one closable opening, in particular for the aerosol outlet. A small opening (approximately 10 $mm^2$) or multiple small openings (total surface area approximately 100 $m^2$) makes or make it possible for the aerosol generated in the reaction vessel (in this case also referred to as aerosolization cell) to be converted into a directed aerosol jet. Using a molecular sieve, the molar mass of the evaporated species, or of the species suspended in the aerosol particles, or of the hydridosilanes present in solution can be regulated. The mean particle size of the aerosol is dependent on the monomeric and polymeric hydridosilane and nanoparticle concentrations in the particular solution, if both the polymerization method and the aerosol formation are carried out within the device, it may be advantageous, in the first step of polymerizing the composition, to initially close the openings of the vessel, and to open the openings again for coating the substrate surface with the aerosols after the desired mean molar mass of the polymers has been reached, in the second method step of forming the aerosol from the reaction products of the composition.

In one advantageous embodiment for the case where a composition including hydridosilanes and/or nanoparticles is used in the form dissolved in a solvent, the opening neck of the reaction vessel or of the aerosolization cell can be provided with a heating element, such as heating coil, and a power source. By controlling the temperature of the opening neck or by way of aerosol flowing through next to the heating element, partial evaporation of the respective solvent that is still present in the aerosol particles can be achieved, so that the droplet size of the aerosol, and thus the concentration of hydridosilanes or nanoparticles that are applied to the substrate, can be regulated.

In addition to the closable opening, the reaction vessel can comprise at least one further feed/discharge pipe, in particular a second feed/discharge pipe. These additional feed/discharge pipes can be used, for example, to add a gaseous silane, a dopant (solid, liquid or gaseous) or a noble gas to the reaction vessel. For this application, the feed/discharge pipe should preferably be attached so that the inlet opening of the pipe is attached at a height at which the composition is also located, so that the respective additive can be introduced directly into the composition.

The additional feed/discharge pipes can advantageously be used to transport the composition into or out of the reaction vessel, or to transfer the composition between these or to other pieces of equipment and devices, such as a GPC device, a molecular sieve, or to an aerosolization cell.

In a further advantageous embodiment, the device according to the invention is characterized by comprising, in addition to a first reaction vessel containing a composition that includes at least one hydridosilane that is dissolved in at least one organic and/or inorganic solvent, or at least one hydridosilane that is already present in liquid form without solvent, wherein the hydridosilanes comprise at least one linear and/or branched hydridosilane of the general formula $Si_nH_{2n+2}$, where n≥3, and/or a cyclic hydridosilane of the general formula $Si_nH_{2n}$, where n≥3, and/or one of the above-mentioned compositions, to which monosilane- and/or disilane- and/or a boron-containing dopant and/or a phosphorus-containing dopant and/or a noble gas from the group Ar, He and/or nanoparticles and/or a polymerization initiator and/or a catalyst and/or surface tension-modifying agents are added, and which comprises an ultrasound source or a sound transducer for generating acoustic cavitation, a second reaction vessel, which comprises an ultrasound source or sound transducer for generating acoustic cavitation and/or capillary waves and at least one opening, and in which the substrate to be coated is disposed opposite the opening, and the substrate comprises a heating source on the surface that faces away from the coating surface, wherein the second reaction vessel comprises at least one further opening for feeding and removing liquids and/or is connected via at least one line to the first reaction vessel.

The first reaction vessel can comprise a sonotrode as the ultrasound source for generating the acoustic cavitation, and the second reaction vessel (=aerosolization cell) can comprise a piezoceramic as the ultrasound source for generating the acoustic cavitation and/or capillary waves.

The subject matter of the invention will be described in more detail hereafter based on exemplary embodiments and figures, without thereby limiting the subject matter of the invention.

Exemplary Embodiments

EXAMPLE 1

Polymerization of a Composition by Way of a Piezoceramic

A composition having a volume of 1 ml, including 7.7% by weight cyclopentasilane in cyclooctane, was placed in the reaction vessel (1) and sonified at a process temperature of approximately 60° C. for approximately 220 minutes using an ultrasonic frequency of approximately 2 megahertz (MHz), and caused to polymerize by way of acoustic cavitation until a slight solution turbidity was detectable. A piezoceramic and the device according to FIG. 1 were used for this purpose. The opening (6) of the device was closed for the polymerization process. The mean molar mass $M_w$ of the polymers produced according to the invention, ascertained by way of gel permeation chromatography (GPC), was 1416 g/mol, for example.

EXAMPLE 2

Polymerization of a Composition by Way of a Sonotrode

A composition having a volume of 0.8 ml, including 5.6% by weight cyclopentasilane in cyclooctane, was placed in the reaction vessel (1) and sonified at a process temperature of less than 65° C. for approximately 50 minutes using an ultrasonic frequency of approximately 25 kilohertz (kHz), and caused to polymerize by way of acoustic cavitation until a slight turbidity was detectable. A sonotrode and the device according to FIG. 2 were used for this purpose. The opening (6) of the device was closed for the polymerization process. The mean molar mass $M_w$ of the polymers produced according to the invention, ascertained by way of gel permeation chromatography (GPC), was 1430 g/mol.

EXAMPLE 3

Coating a Substrate with Polymers by Way of Spin Coating

The reaction products from Example 1, containing higher hydridosilanes, were subsequently removed from the device via the feed/discharge pipe (3) and applied to a glass substrate by way of spin coating, which is known from the prior art, at a rotation speed of 2000 revolutions per minute (rpm) for 45 seconds. Following conversion on a heating plate at approximately 350° C., the layer had a thickness of 25 nm. FIG. 3 shows a Raman spectrum of this silicon layer, in which it is apparent that the layer has a completely amorphous character due to the transverse optical (TO) Raman scattering peak at an approximate wavenumber of 480 $cm^{-1}$.

The reaction products from Example 2 were likewise applied to a glass substrate by way of spin coating at 2000 rpm for 50 seconds and subsequently converted at approximately 350° C. The thickness of the resulting amorphous layer was 38 nm.

EXAMPLE 4

Coating a Substrate with Nanoparticles with the Aid of Nanoparticle Aerosol Droplets A composition containing $Fe_2O_3$ nanoparticles having a diameter of approximately 40 nm was dispersed in an organic/inorganic solvent mixture, placed in the reaction vessel (1), and subsequently converted into nanoparticle aerosol droplets by way of acoustic cavitation and/or capillary waves, and applied to a structured substrate surface. A piezoceramic and the device according to FIG. 1 were used for this purpose. The coating of the substrate surface with the nanoparticle aerosol droplets was carried out at room temperature (approximately 23° C.) and within a coating time of approximately 3 seconds. The acoustic cavitation and capillary wave formation triggered by the piezoceramic resulted in the formation of nanoparticle aerosol droplets, which migrated through the opening (6) of the reaction vessel (1) and were deposited on the substrate (8), which is disposed opposite the opening (6). As is apparent from FIG. 4, the nanoparticles present in the aerosol droplets are uniformly/homogeneously distributed across the entire substrate surface, structured with etched craters.

The following exemplary embodiments can be used to demonstrate the polymerization method for a hydridosilane according to the invention, and in particular for a lower silane, by way of acoustic cavitation:

EXAMPLE 5

Coating a Substrate with a Composition Containing Trisilane without the Polymerization Method According to the Invention Approximately 20 μl is withdrawn from a composition having a volume of 0.6 ml, including 11% by weight trisilane in cyclooctane, and applied to a glass substrate by way of spin coating, which is known from the prior art, at a rotation speed of 2000 revolutions per minute (rpm) for 20 seconds. After this glass substrate was heated on a heating plate at 45° C. for 5 minutes, no layer formation whatsoever was observed.

EXAMPLE 6

Coating a Substrate with a Thermally Treated Composition Including Trisilane without the Polymerization Method According to the Invention A composition having a volume of 0.6 ml, including 11% by weight trisilane in cyclooctane, is heated on a heating plate in an open glass vessel for 625 minutes, so that the composition reaches a temperature of between 70° C. and 75° C. Fresh trisilane is added on a regular basis to compensate for evaporation losses. The composition remains transparent after this treatment. Approximately 20 μl is withdrawn from this composition and applied to a glass substrate by way of spin coating, which is known from the prior art, at a rotation speed of 2000 revolutions per minute (rpm) for 20 seconds. After this glass substrate thus treated was heated on a heating plate at 450° C. for 5 minutes, no layer formation whatsoever was observed.

EXAMPLE 7

Coating a Substrate with a Composition that is Treated by way of Acoustic Cavitation and Includes Trisilane A composition having a volume of 1 ml, including 18% by weight trisilane in cyclooctane, is treated for 145 minutes in an open glass vessel by way of a sonotrode. The composition remains at a stable temperature of approximately 70° C. After sonication for 70 minutes by way of the sonotrode, the composition shows a light brown coloration, and after approximately 130 minutes it shows a dark gray coloration. Approximately 20 μl is withdrawn from the composition and applied to a glass substrate by way of spin coating, which is known from the prior art, at a rotation speed of 2000 revolutions per minute (rpm) for 20 seconds. After this glass substrate thus treated was heated on a heating plate at 450° C. for 5 minutes, the formation of light brown, solid silicon residues can be observed on the surface.

EXAMPLE 8

Coating a Substrate with a Composition that is Treated by way of UV Radiation and Includes Trisilane A composition having a volume of 0.6 ml, including 11% by weight trisilane in cyclooctane, is treated for 700 minutes with UV light having a wavelength of 365 nm. The composition remains transparent after this irradiation. Approximately 20 μl is withdrawn from the composition thus treated and applied to a glass substrate by way of spin coating, which is known from the prior art, at a rotation speed of 2000 revolutions per minute (rpm) for 20 seconds. After this glass substrate was heated on a heating plate at 450° C. for 5 minutes, no layer formation whatsoever was established.

EXAMPLE 9

Coating a Substrate with a Composition that is Treated by way of Acoustic Cavitation and UV Eradiation and Includes Trisilane From the composition from Example 7, which, as described in Example 7, was treated by way of acoustic cavitation, 0.2 ml is withdrawn and mixed with 50 µl fresh trisilane. This composition is now irradiated for 300 minutes with UV light having a wavelength of 365 nm. A lemon yellow coloration is observed for the composition. Approximately 20 µl is withdrawn from the composition thus treated and applied to a glass substrate by way of spin coating, which is known from the prior art, at a rotation speed of 2000 revolutions per minute (rpm) for 20 seconds. After this glass substrate was heated on a heating plate at 450° C. for 5 minutes, the formation of an approximately 20 nm thick, light orange silicon layer was established.

DESCRIPTION OF THE PREFERRED EMBODIMENTS

Figure 1:
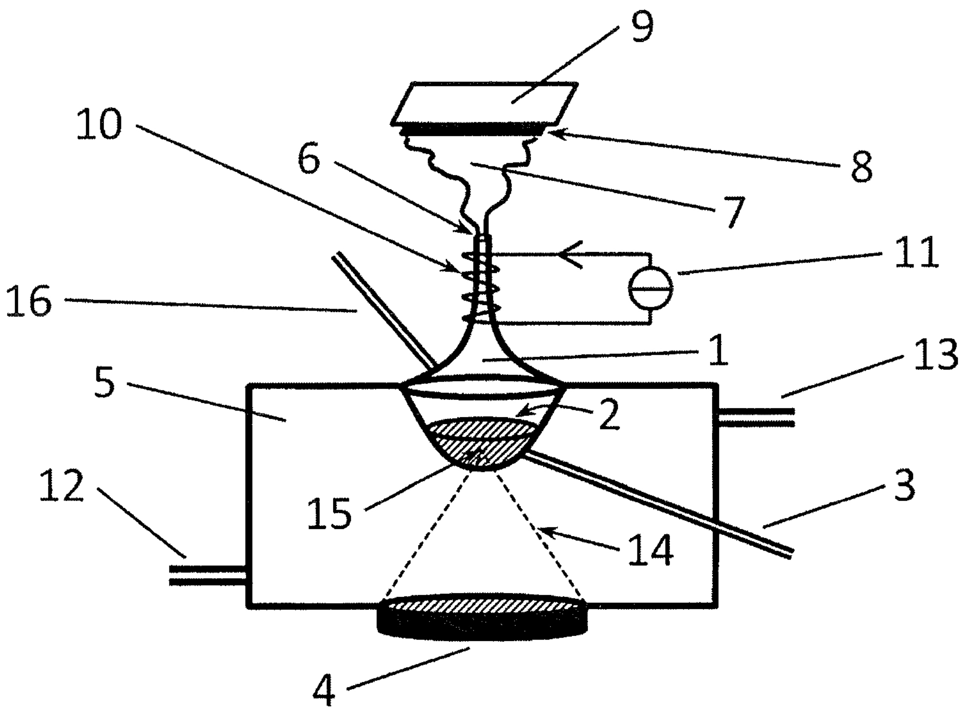
FIG. 1 shows a device according to the invention, which is suitable for carrying out the method according to the invention, in particular for both polymerization and aerosol formation.

The device for carrying out the method according to the invention according to FIG. 1 comprises a reaction vessel (1), containing a composition (2) that includes at least one hydridosilane that is dissolved in at least one organic and/or inorganic solvent, or at least one hydridosilane that is already present in liquid form without solvent, wherein the hydridosilanes comprise at least one linear and/or branched hydridosilane of the general formula $Si_nH_{2n+2}$, where n≥3, and/or a cyclic hydridosilane of general formula $Si_nH_{2n}$, where n≥3, and/or including the above-mentioned hydridosilane solution or the pure already liquid hydridosilane, to which at least monosilane-containing and/or disilane-containing and/or a boron-containing dopant and/or a phosphorus-containing dopant and/or a noble gas from the group Ar, He and/or nanoparticles and/or a polymerization initiator and/or a catalyst and/or surface tension-modifying agents are added. The device furthermore comprises an ultrasound source or a sound transducer (4) for generating acoustic cavitation and/or capillary waves. The reaction vessel (1) is located (partially or entirely) in a coolant vessel (5) provided with a coolant inlet (12) and outlet (13). In the present embodiment of the device, a piezoceramic is used as the ultrasound source (4), which is not in direct contact with the composition, but transmits the ultrasonic waves (14) to the reaction vessel (1) surrounded by the coolant via an intermedium, which in the present case is a coolant in a coolant vessel (5), for example. The reaction vessel (1) has a closable opening (6), in particular for the aerosol (7). So as to coat the substrate surface, the composition polymerized according to the invention in a first method step can either be withdrawn from the reaction vessel (1) via one of the openings (3, 6, 16) and can be used, for example, for a subsequent spin coating process, or it remains in the reaction vessel (1) and is converted into aerosol droplets/aerosols according to the invention in a subsequent method step. The substrate (8) to be coated can be disposed opposite the opening (6). The substrate (8) comprises a heating source (9) on the surface that faces away from the coating surface. If hydridosilanes are used that are dissolved in at least one solvent, in one advantageous embodiment of the device, the opening neck of the reaction vessel (1) can be provided with a heating coil (10) and a power source (11) so as to regulate the particle size of the aerosol (7), in that the solvent is able to evaporate due to the supply of heat. The ultrasonic waves (14) can be focused on a focal point (15) in the reaction vessel (1). The reactants and products of the composition (2) can be transported into or out of the reaction vessel (1) by way of a feed/discharge pipe (16). Furthermore, it is also possible to add gaseous silanes, dopants or other gases, for example, through the feed/discharge pipe (16). In addition to the first feed/discharge pipe (16), the reaction vessel (1) can also comprise a second feed/discharge pipe (3).

In an alternative embodiment of the device, in which the ultrasound source likewise acts on the composition (2) via an intermedium, a sonotrode may also be used. The reaction vessel (1) can be located within a coolant vessel (5) for this purpose, which is provided with a coolant and can comprise both a coolant inlet (12) and a coolant outlet (13). The reaction vessel (1) can have a tube design for this purpose, having a widened region for accommodating a larger composition volume, and can comprise two, optionally closable, openings. These openings protrude from the coolant vessel (5) so that reactants and products of the method according to the invention can be fed from the outside of the coolant vessel (5) or discharged via these openings. The sonotrode is disposed so as to protrude into the coolant and thereby have direct contact only with this coolant/intermedium. The transmission of the ultrasonic waves (14) to the composition (2) in the reaction vessel (1) for polymerizing the composition thus also takes place indirectly via the coolant, which thus also fulfills the function of an intermedium. The sonotrode (4) can remain in the coolant vessel (5), sealed via an G-ring, for example. So as to coat the substrate surface, the composition polymerized according to the invention can either be withdrawn from the reaction vessel (1) via one of the openings and can be used, for example, for a subsequent spin coating process, or it remains in the reaction vessel (1) and is converted into aerosol particles according to the invention in a subsequent method step. The substrate to be coated can be selectively disposed in front of one opening or else both openings for this purpose, so that the formed aerosol particles can be deposited on this surface. As was already described above, the substrate (8) can comprise a heating source (9) on the surface that faces away from the coating surface. If hydridosilanes are used that are dissolved in at least one solvent, in one advantageous embodiment of the device, one or both openings of the reaction vessel (1) can be provided with a heating coil (10) and a power source (11) so as to regulate the particle size of the aerosol (7), in that the solvent is able to evaporate due to the supply of heat.

Figure 2:
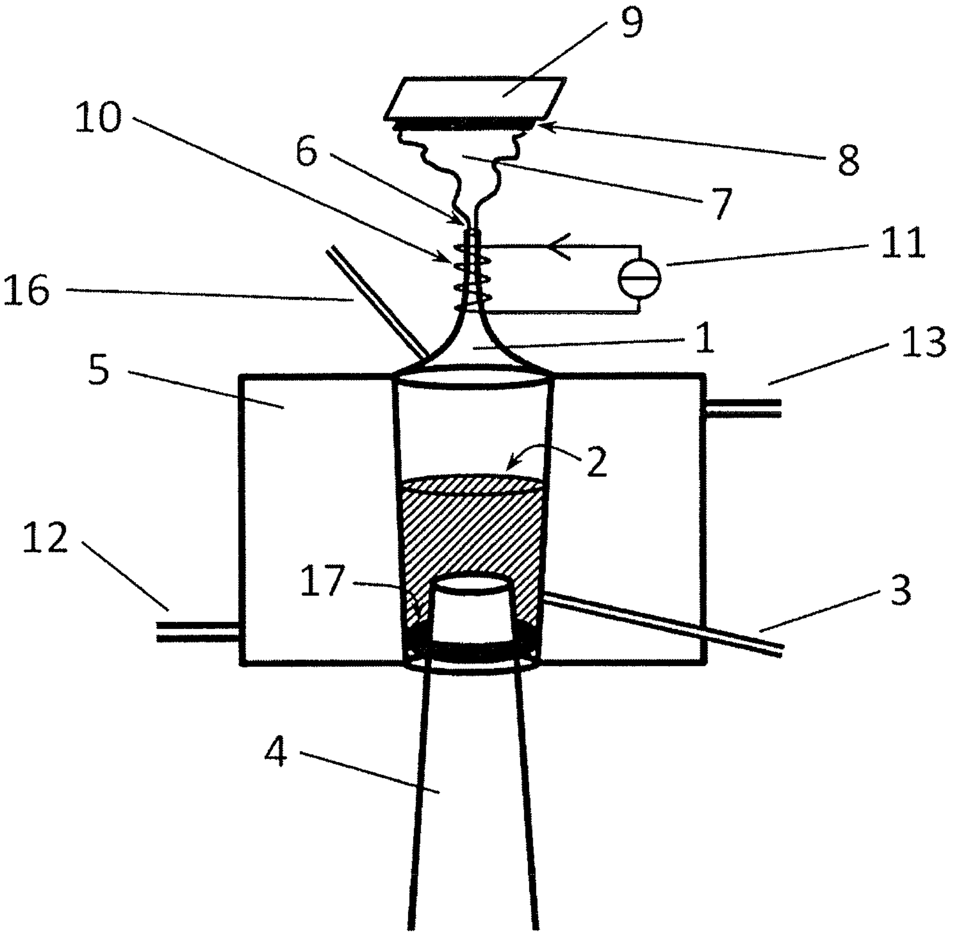
FIG. 2 shows an alternative device according to the invention, which is likewise suitable for carrying out the method according to the invention, in particular for both polymerization and aerosol formation.

FIG. 2 shows a further device according to the invention, which is likewise suitable for carrying out the method according to the invention. This device according to FIG. 2 likewise comprises a reaction vessel (1) containing a composition (2) that includes at least one hydridosilane solution, comprising at least one linear or branched hydridosilane of the general formula $Si_nH_{2n+2}$, where n≥3, and/or a cyclic hydridosilane of the general formula $Si_nH_{2n}$, where n≥3, which are dissolved in at least one solvent, or a pure liquid silane solution, comprising one or more liquid hydridosilanes, which are already present in liquid form without solvent, or a solution to which optionally at least monosilane- and/or disilane- and/or boron-containing dopant and/or a phosphorus-containing dopant and/or a noble gas from the group Ar, He and/or nanoparticles and/or a polymerization initiator and/or a catalyst and/or surface tension-modifying agents are added. The device comprises an ultrasound source (4) for generating acoustic cavitation and/or capillary waves. A sonotrode was used in the example shown here. The reaction vessel (1) is located (partially or entirely) in a coolant vessel (5) provided with a coolant inlet (12) and outlet (13). The reaction vessel (1) has an opening (6), in particular for the aerosol (7). The substrate (8) to be coated is disposed opposite the opening (6). The substrate (8) comprises a heating source (9) on the surface that faces away from the coating surface. If hydridosilanes are used that are dissolved in at least one solvent, the opening neck of the reaction vessel (1) is provided with a heating coil (10) and a power source (11) so as to regulate the particle size of the aerosol (7). The composition (2) can be transported into or out of the reaction vessel (1) by way of a feed/discharge pipe (16). In addition to the first feed/discharge pipe (16), the reaction vessel (1) can also comprise a second feed/discharge pipe (3). In FIG. 2, the ultrasound source (4) for generating acoustic cavitation and/or capillary waves is a sonotrode, which is disposed so as to protrude into the reaction vessel (1) containing the composition (2) and is thereby in direct contact with the composition (2). The ultrasound source (4) can remain in the reaction vessel (1), sealed via an O-ring (17), for example.

Figure 3:
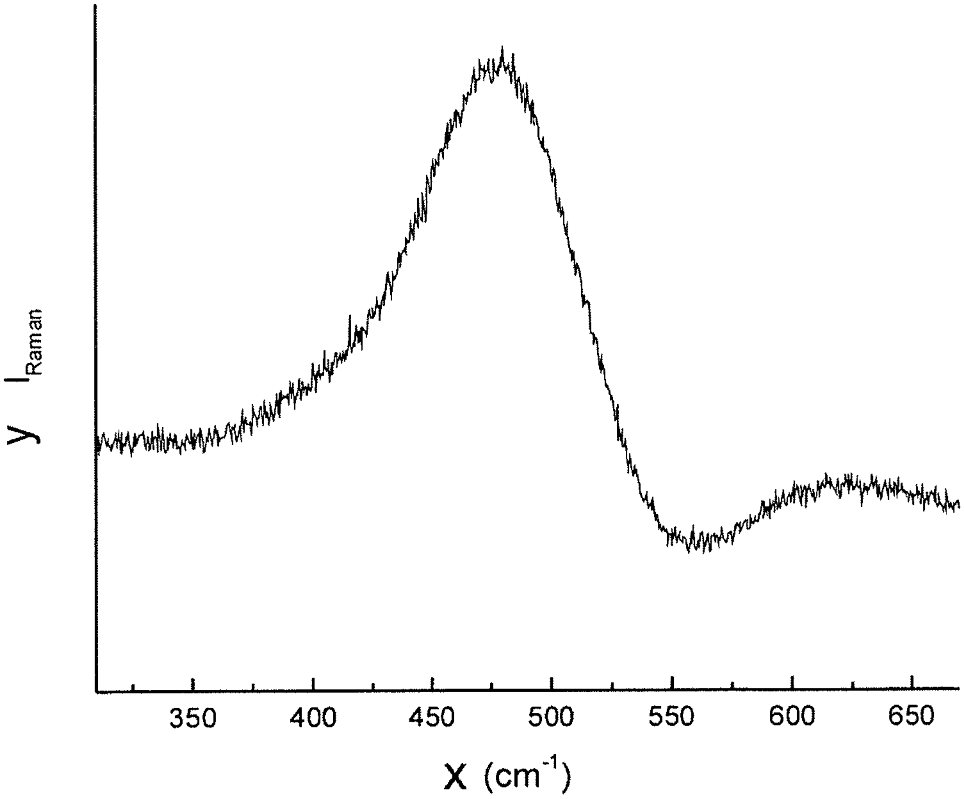
FIG.3 shows a Raman spectrum of a silicon-containing layer after the conversion according to exemplary embodiment 2.

FIG. 3 shows a Raman spectrum of a silicon-containing layer after the conversion according to exemplary embodiment 2. The abscissa X indicates the wavenumber in [$cm^{-1}$], and the ordinate Y indicates the Raman intensity $I_{Ramen}$, in a non-dimensional unit. The TO Raman scattering peak at approximately 480 $cm^{-1}$ points to amorphous silicon.

Figure 4:
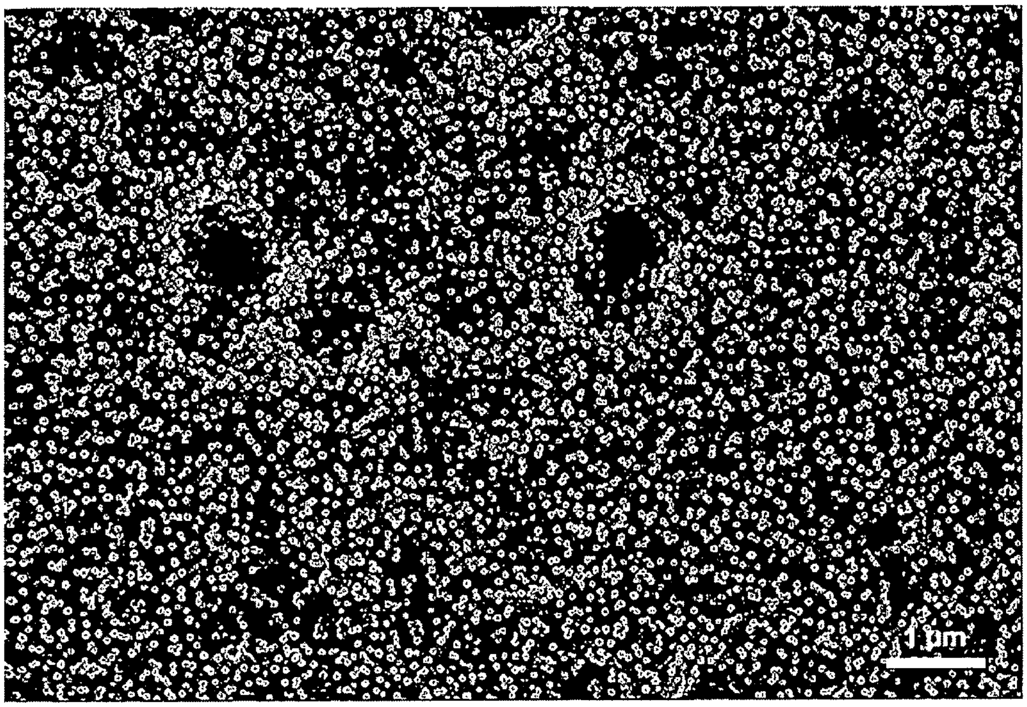
FIG.4 shows a scanning electron microscope (SEM) image of a structured p-type CVD silicon layer covered with $Fe_2O_3$ nanoparticles (white circular dots) in the aerosolization cell by the way of aerosol coating.

FIG. 4 shows a scanning electron microscope (SEM) image of a structured p-type CVD silicon layer covered with $Fe_2O_3$ nanoparticles (white circular dots) in the aerosolization cell by way of aerosol coating. The darker, circular areas correspond to the depressions of the etched craters.

Figure 5:
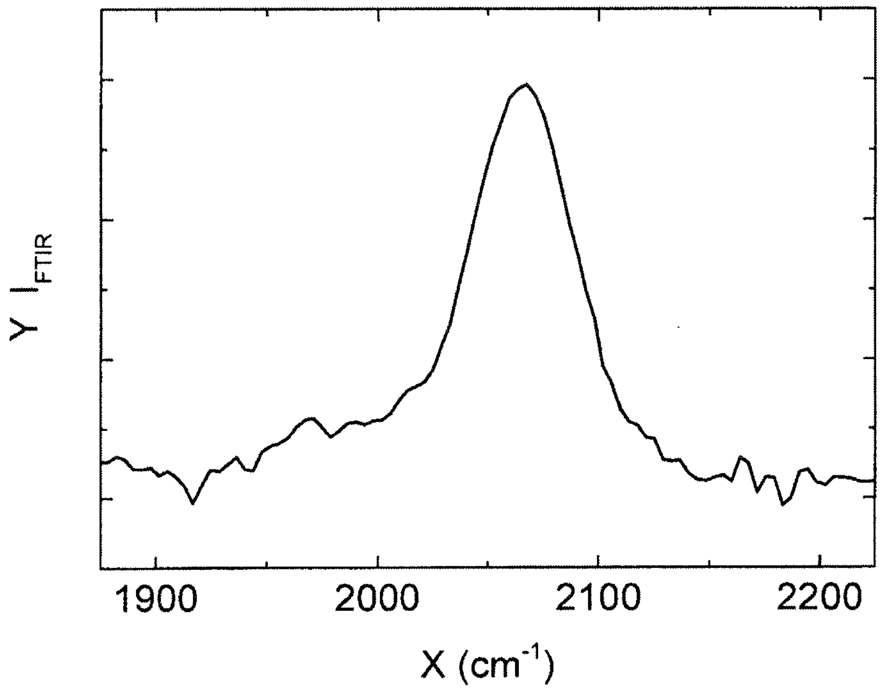
FIG.5 shows a Fourier transform infrared spectroscopy (FTIR) spectrum of a trisilane precursor-based layer according to Example 9, which is applied to silicon wafers.

FIG. 5 shows a Fourier transform infrared spectroscopy (FTIR) spectrum of a trisilane precursor-based layer according to Example 9, which is applied to silicon wafers. The abscissa X indicates the wavenumber in $cm^{-1}$. The ordinate Y indicates the FTIR signal intensity $I_{FTIR}$ in relative units. The modes between wavenumbers 2000 and 2080 $cm^{-1}$ are characteristic of Si—H or Si—$H_2$ stretching vibrations in a-Si:H.

Figure 6:
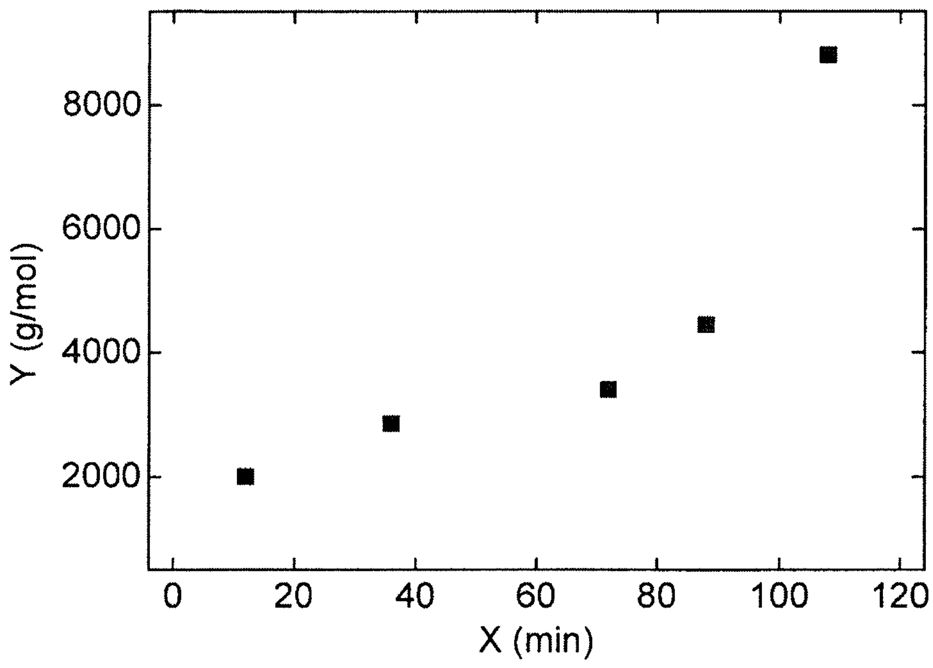
FIG. 6 shows the growth of the molecular mass (Mw) in a composition that includes 10% by weight cyclopentasilane (CPS) in cycloctane polymerized by way of ultrasonic treatment.

FIG. 6 shows the growth of the molecular mass (Mw) in a composition that includes 10% by weight cyclopentasilane (CPS) in cyclooctane polymerized by way of ultrasonic treatment. The abscissa X indicates the sonication time in minutes (min). The ordinate Y indicates the molecular mass $M_w$ in grams per mole (g/mol). The $M_w$ was ascertained by way of gel permeation chromatography (GPC) using PS standards.

Figure 7:
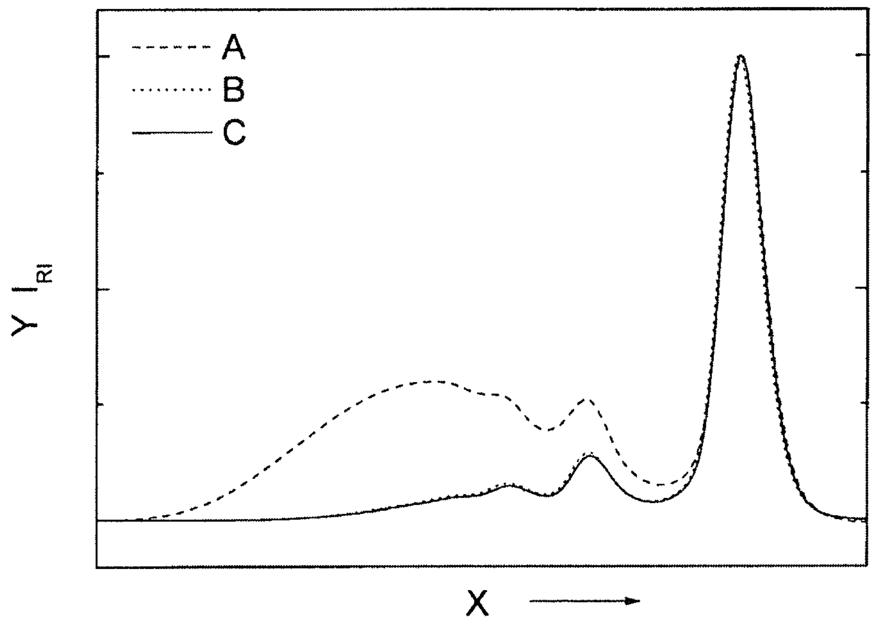
FIG. 7 shows GPC chromatograms of (A)=a CPS solution sonified for 188 minutes, (B)=a CPS solution treated thermally at approximately 70° C. for 625 minutes, and (C)=an untreated CPS solution.

FIG. 7 shows GPC chromatograms of (A)=a CPS solution sonified for 188 minutes, (B)=a CPS solution treated thermally at approximately 70° C. for 625 minutes, and (C)=an untreated CPS solution. The abscissa X indicates the elution time. The ordinate Y indicates the normalized intensity of the refractive index detector $I_{RI}$. The sharp peak in the right of the chromatogram is generated by non-reacted CPS. Contrary to the curves (B) and (C), an increased concentration of hydridosilanes can be ascertained in curve (A), which is to say in the CPS solution treated according to the invention, to the left of the CPS peak. This observation indicates the effect according to the invention, which is not photolytically-based and not thermally-based, of increasing $M_w$ or polymerization of a hydridosilane by way of sonication.

LITERATURE CITED IN THE APPLICATION

[1] Iyer, G., et al., Solution-Based Synthesis of Crystalline Silicon from Liquid Silane through Laser and Chemical Annealing, ACS Appl. Mater. Interfaces 4, 2680-2685 (2012)

[2] Shimoda, I., et al., Solution-Processed silicon films and transistors, Nature 440, 783-786 (2008)

[3] Masuda, T., et al., Fabrication of solution-processed hydrogenated amorphous silicon single-junction solar cells, Appl. Rhys. Lett. 100, 253908 (2012)

[4] Suslick, K. S., Price, G. J., Applications of Ultrasound to Material Chemistry, Annu. Rev. Mater. Sci. 29, 295-326 (1999)

[5] Lang, R. J., Ultrasonic Atomization of Liquids, J. Acous. Soc. Am. 34, 1 (1962)

[WO 2011/061106 A2]

[DE 10 2010 041 842 A1]

[WO 2012/084261 A1]

[WO 2011/104147 A1]

[EP 1087428 A1]

The invention claimed is:

1. A method for polymerizing a composition including hydridosilanes and subsequently using the polymers to produce silicon containing layers, comprising the following steps:

a) providing a substrate;

providing a composition including at least one hydridosilane, which is dissolved in at least one organic and/or inorganic solvent, or including at least one hydridosilane that is already present in liquid form without solvent , wherein the hydrosilanes comprises at least one linear and/or branched hydridosilane of the general formula $Si_nH_{2n+2}$ where n≥3, and/or a cyclic hydridosilane of the general formula $Si_nH_{2n}$, where n≥3;

c) polymerizing the composition from step b) by way of acoustic cavitation; and d) coating the surface of the substrate with reaction products from step c).

2. The method according to claim 1, wherein the composition from step b) comprises at least one lower hydridosilane having a molar mass between 90 and 305 g/mol, in particular from the group trisilane, tetrasilane, pentasilane, hexasilane, heptasilane, cyclopentasilane, cyclohexasilane or neopentasilane.

3. The method according to claim 1 wherein at least a monosilane and/or disilane and/or boron containing dopant and/or a phosphorus containing dopant and/or a noble gas from the group Ar, He and/or nanoparticles and/or a polymerization initiator and/or a catalyst and/or surface tension modifying agents is/are added to the hydridosilane solution or the pure liquid hydridosilane.

4. A method according to claim 1, wherein the reaction products from step c) are converted into aerosols by way of acoustic cavitation and/or capillary waves, and can be brought in contact with the surface of the substrate for the coating process according to step d).

5. A method according to claim 4, wherein the method is carried out in two reaction vessels, the polymerization by way of acoustic cavitation according to step c) being carried out in one reaction vessel, and the aerosol formation by way of acoustic cavitation and/or capillary waves being carried out in a further reaction vessel.

6. A method according to claim 4, wherein the method is carried out in a device, both the polymerization by way of acoustic cavitation according to step c) and the aerosol formation by way of acoustic cavitation and/or capillary waves being carried out in one reaction vessel.

7. A method according to claim 4, wherein the aerosol droplets are conducted through a closable opening in a reaction vessel in a manner directed at the substrate surface.

8. A method according to claim 1, wherein the acoustic cavitation is generated by way of a magnetorestrictive or piezoelectric ultrasound source and/or a liquid operated or gas operated sound transducer.

9. A method according to claim 1, wherein an ultrasound source and/or a sound transducer are brought in direct contact with the composition from step b) or c) for the polymerization according to step c) and/or for converting the reaction products from step c) into aerosols, or are brought in contact with the composition from step b) or c) by way of an intermedium.

10. A method according to claim 1, wherein the polymerization is carried out at temperatures between −70 ° C. and 155° C.

11. A method according to claim 1, wherein the polymerization is carried out using a sonication duration between 1 microsecond and 15 hours.

12. A method according to claim 1, wherein the polymerization speed (=increase in the molar mass (g/mol) per unit time), the polymerization yield (=percentage of monomeric hydridosilanes that are polymerized into higher hydridosilanes), the aerosol formation rate (=volume of aerosols generated per unit time), and the aerosol flow in the direction of the substrate (=volume of aerosols generated per unit time per unit surface area) are set by way of the concentration of added nanoparticles, the residual concentration of the reactants (=monomeric hydridosilanes), the operating mode (which is to say continuous or pulsed), the amplitude and frequency of the ultrasound source/the sound transducer which generates the acoustic cavitation and/or capillary waves, and via cooling devices.

13. A method according to claim 1, wherein when pure liquid hydridosilanes are used, the substrate is coated with gaseous silanes and/or liquid or solid hydridosilanes having a molar mass between 32 g/mol and $1\times10^{6}$ g/mol, and when a hydridosilane solution is used, the substrate is coated both with gaseous silanes and/or liquid hydridosilanes or solid hydridosilanes and with the gaseous silanes and/or hydridosilanes that are present in the form of solvent/hydridosilane aerosol droplets.

14. A method according to claim 1, wherein reaction products from step c) are brought in contact with the surface of the substrate according to step d) by way of spin coating and/or immersion coating method and/or blade coating and/or ink jet printing.

15. A method according to claim 1, wherein conversion is carried out in a hydrogen containing and/or low-pressure atmosphere after the coating process.

16. A method according to claim 1, wherein UV irradiation is carried out and/or thermal energy is supplied during the polymerization process according to step c).

17. A method according to claim 1, wherein nanoparticles are added to the hydridosilane solution, or the hydridosilane present in liquid form without solvent, to achieve the composition of step b).

18. A method according to claim 17, wherein said coating the surface of the substrate with reaction products from step c) results in a silicon containing layer having nanoparticles therein, and further comprising using the silicon containing layer to produce a semiconducting or insulating thin layer with nanoparticles embedded therein.

19. A method according to claim 1, wherein the polymerization is carried out at temperatures between −55° C. and 150° C.

20. A method according to claim 1, wherein the polymerization is carried out using a sonication duration between 0.05 and 12 hours.

* * * * *